US010615337B2

(12) United States Patent
Manandhar et al.

(10) Patent No.: US 10,615,337 B2
(45) Date of Patent: Apr. 7, 2020

(54) PROCESS FOR CREATING A HIGH DENSITY MAGNETIC TUNNEL JUNCTION ARRAY TEST PLATFORM

(71) Applicant: SPIN MEMORY, INC., Fremont, CA (US)

(72) Inventors: Pradeep Manandhar, Fremont, CA (US); Prachi Shrivastava, Fremont, CA (US); Mustafa Pinarbasi, Fremont, CA (US); Thomas Boone, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/388,774

(22) Filed: Apr. 18, 2019

(65) Prior Publication Data
US 2019/0371997 A1 Dec. 5, 2019

Related U.S. Application Data

(62) Division of application No. 15/992,815, filed on May 30, 2018, now Pat. No. 10,411,185.

(51) Int. Cl.
H01L 43/12 (2006.01)
H01L 27/22 (2006.01)
(Continued)

(52) U.S. Cl.
CPC .......... H01L 43/12 (2013.01); H01L 21/3065 (2013.01); H01L 21/31051 (2013.01);
(Continued)

(58) Field of Classification Search
CPC ................... H01L 27/222; H01L 43/08; H01L 23/49541–49565;
(Continued)

(56) References Cited

U.S. PATENT DOCUMENTS 4,597,487 A 7/1986 Crosby et al.
5,541,868 A 7/1996 Prinz
(Continued)

FOREIGN PATENT DOCUMENTS

CA 2766141 1/2011
CN 105706259 6/2016
(Continued)

OTHER PUBLICATIONS

US 7,026,672 B2, 04/2006, Grandis (withdrawn)
(Continued)

Primary Examiner — Julia Slutsker

(57) ABSTRACT

A method for a photo and/or electron beam lithographic fabricating processes for producing a pillar array test device. The method includes receiving a wafer having a plurality of bit cells arranged in a grid and etching a plurality of bottom electrode traces to connect a plurality of bottom electrode pads in a centrally located bit cell to each of the bit cells in the grid. The method further includes fabricating an array of magnetic tunnel junction pillars onto each respective pad in the centrally located bit cell. The wafer is then planarized. The method further includes etching a plurality of top electrode traces to connect the plurality of magnetic tunnel junction pillars to each of the bit cells in the grid, and outputting the wafer for subsequent testing.

24 Claims, 5 Drawing Sheets

Wafer with front end CMOS platform with SiOx passivation on top.

Metal posts are fabricated from each individual BE pads and then planarized.

Metal pads are fabricated from each individual BE pads and then planarized.

(51) Int. Cl.
  *H01L 21/3065* (2006.01)
  *H01L 43/08* (2006.01)
  *H01L 43/02* (2006.01)
  *H01L 21/3105* (2006.01)

(52) U.S. Cl.
  CPC ............ *H01L 27/222* (2013.01); *H01L 43/02* (2013.01); *H01L 43/08* (2013.01)

(58) Field of Classification Search
  CPC ........................ H01L 23/49838–49844; H01L 21/4821–4842; G01R 33/098; G11B 5/3909
  See application file for complete search history.

(56) References Cited

U.S. PATENT DOCUMENTS

| | | |
|---|---|---|
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,927,569 B2 | 8/2005 | Worledge et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,363 B1 | 11/2005 | Huai |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,339 B2 | 2/2006 | Kawabata et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,323,890 B2 | 1/2008 | Petersen et al. |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |

(56) References Cited

U.S. PATENT DOCUMENTS

| | | |
|---|---|---|
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,732,881 B2 | 6/2010 | Wang |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,863,911 B2 | 1/2011 | Hong et al. |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozak |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,383 B2 | 6/2013 | Liu |
| 8,456,926 B2 | 6/2013 | Ong et al. |
| 8,477,530 B2 | 7/2013 | Ranjan et al. |
| 8,492,381 B2 | 7/2013 | Kuroiwa et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,312 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,306 B2 | 1/2016 | Mekhanik et al. |
| 9,229,853 B2 | 1/2016 | Khan et al. |
| 9,231,491 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |

(56) References Cited

U.S. PATENT DOCUMENTS

| | | |
|---|---|---|
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2009/0256220 A1 | 10/2009 | Horng et al. |
| 2009/0285017 A1 | 11/2009 | Yamane et al. |
| 2010/0023287 A1 | 1/2010 | Worledge et al. |
| 2010/0033881 A1 | 2/2010 | Carey et al. |
| 2010/0096716 A1 | 4/2010 | Ranjan et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0326712 A1 | 12/2012 | Tudosa et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0148417 A1 | 6/2013 | Zhou et al. |
| 2013/0244344 A1 | 9/2013 | Malmhall et al. |

(56) References Cited

U.S. PATENT DOCUMENTS

| | | | |
|---|---|---|---|
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0314982 A1 | 11/2013 | Zhou et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |
| 2019/0206928 A1* | 7/2019 | Li .................. G11C 11/161 |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)
Bhatti Sabpreet et al., "Spintronics Based Random Access Memory: a Review," Material Today, Nov. 2107, pp. 530-548, vol. 20, No. 9, Elsevier.
Helia Naeimi, et al., "STTRAM Scaling and Retention Failure," Intel Technology Journal, vol. 17, Issue 1, 2013, pp. 54-75 (22 pages).
S. Ikeda, et al., "A Perpendicular-Anisotropy CoFeB—MgO Magnetic Tunnel Junction", Nature Materials, vol. 9, Sep. 2010, pp. 721-724 (4 pages).
R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).
K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).
Kirsten Martens, et al., "Thermally Induced Magnetic Switching in Thin Ferromagnetic Annuli", NSF grants PHY-0351964 (DLS), 2005, 11 pages.
Kristen Martens, et al., "Magnetic Reversal in Nanoscropic Ferromagnetic Rings", NSF grants PHY-0351964 (DLS) 2006, 23 pages.
"Magnetic Technology Spintronics, Media and Interface", Data Storage Institute, R&D Highlights, Sep. 2010, 3 pages.
Daniel Scott Matic, "A Magnetic Tunnel Junction Compact Model for STT-RAM and MeRAM", Master Thesis University of California, Los Angeles, 2013, pp. 43.

* cited by examiner

102 Wafer with front end CMOS platform with SiOx passivation on top.

104 Metal posts are fabricated from each individual BE pads and then planarized.

106 Metal pads are fabricated from each individual BE pads and then planarized.

100

107

202
Wafer with front end CMOS platform with SiOx passivation on top.

204
Additional BE pad connectors are fabricated and planarized.

206
New metal posts are created on the center BE pad to create base for MTJ pillar array. The wafer is then planarized.

200

302 MTJ stack deposition

304 HDP MTJ pillars are fabricated as usual and planarized.

306 TE is deposited over the MTJ pillars.

PROCESS FOR CREATING A HIGH DENSITY MAGNETIC TUNNEL JUNCTION ARRAY TEST PLATFORM

This application is a Divisional of co-pending commonly assigned U.S. patent application Ser. No. 15/992,815, titled "A PROCESS FOR CREATING A HIGH DENSITY MAGNETIC TUNNEL JUNCTION ARRAY TEST PLATFORM" by Pradeep Manandhar, et al., filed on May 30, 2018, and which is incorporated herein in its entirety.

FIELD OF THE INVENTION

Embodiments of the present invention are generally related to the fabrication of integrated circuit structures used in memory systems that can be used by computer systems, including embedded computer systems.

BACKGROUND OF THE INVENTION

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction (MTJ).

MRAM devices can store information by changing the orientation of the magnetization of the free layer of the MTJ. In particular, based on whether the free layer is in a parallel or anti-parallel alignment relative to the reference layer, either a one or a zero can be stored in each MRAM cell. Due to the spin-polarized electron tunneling effect, the electrical resistance of the cell change due to the orientation of the magnetic fields of the two layers. The electrical resistance is typically referred to as tunnel magnetoresistance (TMR) which is a magnetoresistive effect that occurs in a MTJ. The cell's resistance will be different for the parallel and anti-parallel states and thus the cell's resistance can be used to distinguish between a one and a zero. One important feature of MRAM devices is that they are non-volatile memory devices, since they maintain the information even when the power is off.

MRAM devices are considered as the next generation structures for a wide range of memory applications. MRAM products based on spin torque transfer switching are already making its way into large data storage devices. Spin transfer torque magnetic random access memory (STT-MRAM), or spin transfer switching, uses spin-aligned (polarized) electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a one or a zero based on whether the free layer is in the parallel or anti-parallel states relative to the reference layer.

The fabrication of MRAM involves the formation of small MTJ (Magnetic Tunnel Junction) patterns in pillar shapes. The pillars or pillar structures can be patterned on a hard mask layer and then transferred to MTJ films. The patterning of pillars on a hard mask layer is traditionally done using an electron beam lithography in a research environment. However, for high volume production, electron beam patterning is not cost effective as the process is very slow. Alternately, these pillars can be patterned using optical lithography tools. Optical lithography resolution is limited by diffraction. Since the pillars, when printed onto a layer of photoresist, are two dimensional features, it is more challenging to achieve the same resolution as the resolution can be achieved by an 1D pattern such as a line.

Currently, MRAM devices are reported at 28 nm node with a bitcell size of, for example, $0.12\ \mu m^2$. Although active MTJ pillar size can be reduced well below 100 nm, the pitch between MTJ devices is limited by individual bitcell size. Consequently, the pitch between CMOS bitcells need to be much larger than the achievable pitch between active MTJ device pillars. This hinders developing a high density MRAM memory with smaller active MTJ device arrays at higher density. With current research to develop, for example, sub 50 nm active MTJ devices, it will become difficult to have a test platform to test state of the art MTJ devices.

Thus what is needed is a fabrication process that will produce a state-of-the-art high density MTJ pillar array to create a test platform to test state of the art MTJ devices. What is further needed is a fabrication process that will produce a state-of-the-art high density MTJ pillar array. Additionally, existing CMOS design configurations need to be utilized without having to invest to develop new CMOS test platform fabrication processes.

SUMMARY OF THE INVENTION

Embodiments of the present invention implement a method for a photo and/or electron beam lithographic fabricating processes for producing a pillar array test device. Embodiments of the present invention implement a fabrication process that will produce a state-of-the-art high density MTJ pillar array to create a test platform to test state-of-the-art MTJ devices. Embodiments of the present invention implement a fabrication process that will produce a state-of-the-art high density MTJ pillar array. Additionally, embodiments of the present invention advantageously utilize existing CMOS design configurations without having to invest to develop new CMOS test platform fabrication processes.

In one embodiment the present invention is implemented as a method for a photo and electron beam lithographic fabricating processes for producing a pillar array test device. The method includes receiving a wafer having a plurality of bit cells arranged in a grid and etching a plurality of bottom electrode traces to connect a plurality of bottom electrode pads in a centrally located bit cell to each of the bit cells in the grid. The method further includes fabricating an array of magnetic tunnel junction pillars onto each respective pad in the centrally located bit cell. The wafer is then planarized. The method further includes etching a plurality of top electrode traces to connect the plurality of magnetic tunnel junction pillars to each of the bit cells in the grid, and outputting the wafer for subsequent testing.

In this manner, the pillar array test device described above has two primary areas of density. The first area density is the density of the bit cells in the grid of bit cells. The second area density is the density of the magnetic tunnel junction pillars produced on the centrally located bit cell. The second area density is much higher than the first area density. Each of the bit cells has to have at least a minimum pitch width between them in order to be manufacturable. In a normal functioning device, there is one magnetic tunnel junction pillar manufactured on each bit cell. Thus the density of the bit cells becomes the density of the magnetic tunnel junction pillars. With the pillar array test device of the present invention, the magnetic tunnel junction pillars are fabricated all on the centrally located bit cell and then conductive traces are used to link each individual magnetic tunnel junction pillar to a respective bit cell of the grid.

The purpose of producing such a device is to simulate magnetic tunnel junction pillar density that may be available 2 to 3 generations of CMOS fabrication processes later. The pillar array test device enables a manufacturer to test magnetic interactions between adjacent magnetic tunnel junction pillars in a high density array. The pillar array test device enables the study and characterization of any electromagnetic interference that may occur between the pillars. This allows intensive preparation for next generations of MRAM device manufacture.

In one embodiment, the plurality of top electrode traces connect to the bit cells in the grid using vias.

In one embodiment, an array of metal posts are fabricated on top of the plurality of bottom electrode pads to function as a base for the array of magnetic tunnel junction pillars.

In one embodiment, each of the plurality of bottom electrode traces comprises tantalum nitride. In one embodiment, each of the plurality of top electrode traces comprises tantalum nitride.

In one embodiment, each of the plurality of bit cells further comprises a CMOS driving transistor for individually addressing each of the magnetic tunnel junction pillars.

In one embodiment, a silicon oxide passivation layer is deposited on the surface of the wafer.

In one embodiment, the present invention is implemented as a pillar array test device. The device includes a grid of bit cells having a first density, and an array of magnetic tunnel junction pillars fabricated on a centrally located bit cell having a second density that is higher than the first density. The device further includes a bottom electrode layer connecting each of the magnetic tunnel junction pillars to a respective one of the grid of bit cells in a first fanout pattern, and a top electrode layer connecting each of the magnetic tunnel junction pillars to a respective one of the grid of bit cells in a second fanout pattern.

In one embodiment the present invention is implemented as a method for a fabricating process for producing a pillar array test device. The method includes receiving a wafer having a plurality of bit cells arranged in a grid having a first density wherein each of the plurality of bit cells further comprises a CMOS driving transistor, and etching a plurality of bottom electrode traces to connect a plurality of bottom electrode pads in a centrally located bit cell to each of the bit cells in the grid. The method further includes fabricating an array of magnetic tunnel junction pillars onto each respective pad in the centrally located bit cell and having a second density higher than the first density, and planarizing the wafer. The method concludes by etching a plurality of top electrode traces to connect the plurality of magnetic tunnel junction pillars to each of the bit cells in the grid, and outputting the wafer for subsequent testing.

In this manner, embodiments of the present invention implement a method for a photo and electron beam lithographic fabricating processes for producing a pillar array test device. Embodiments of the present invention implement a fabrication process that will produce a state-of-the-art high density MTJ pillar array to create a test platform to test state-of-the-art MTJ devices. Embodiments of the present invention implement a fabrication process that will produce a state-of-the-art high density MTJ pillar array. Additionally, embodiments of the present invention advantageously utilizes existing CMOS design configurations without having to invest to develop new CMOS test platform fabrication processes.

Embodiments of the present invention provide the advantage that the new development in MRAM devices can be independently experimented and tested without having to invest significant effort into developing new CMOS platform used in addressing the MRAM devices. The time and cost to develop new CMOS platforms is many orders of magnitude higher than the approach of the embodiments of the present invention.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Figure 1:
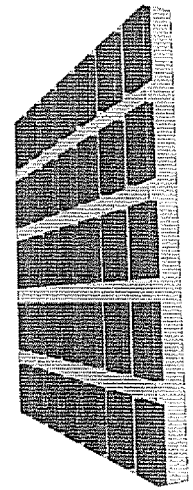
FIG. 1 shows the steps of a process for a photo and/or electron beam lithographic fabricating processes for producing a pillar array test device in accordance with one embodiment of the present invention.
Figure 1:
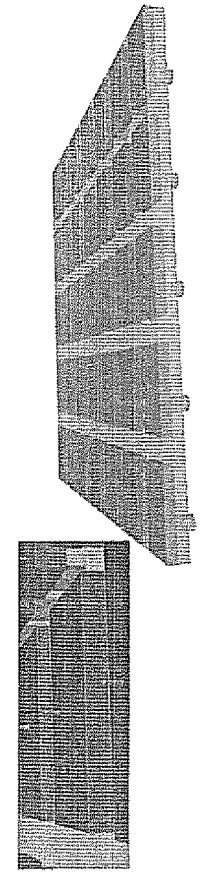
Figure 1:
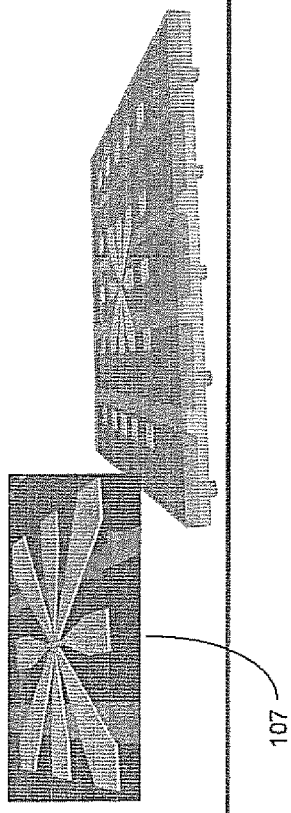

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

A Process for Creating a High Density Magnetic Tunnel Junction Array Test Platform Embodiments of the present invention implement a method for a photo and/or electron beam lithographic fabricating processes for producing a pillar array test device. Embodiments of the present invention implement a fabrication process that will produce a state-of-the-art high density MTJ pillar array to be used as a test platform to test state-of-the-art MTJ devices. Embodiments of the present invention implement a fabrication process that will produce a state-of-the-art high density MTJ pillar array. Additionally, embodiments of the present invention advantageously utilize existing CMOS design configurations without having to invest to develop new CMOS test platform fabrication processes.

In one embodiment the present invention is implemented as a method for a photo and/or electron beam lithographic fabricating processes for producing a pillar array test device. The method includes receiving a wafer having a plurality of bit cells arranged in a grid and etching a plurality of bottom electrode traces to connect a plurality of bottom electrode pads in a centrally located bit cell to each of the bit cells in the grid. The method further includes fabricating an array of magnetic tunnel junction pillars onto each respective pad in the centrally located bit cell. By fabricating each of the magnetic tunnel junction pillars on the centrally located bit cell, as opposed to one magnetic tunnel junction pillar per bit cell, a very high density between adjacent magnetic tunnel junction pillars is achieved. This density is generally 2 to 3 generations of CMOS manufacturing equipment higher than what could normally be achieved. The wafer is then planarized. The method further includes etching a plurality of top electrode traces to connect the plurality of magnetic tunnel junction pillars to each of the bit cells in the grid, and outputting the wafer for subsequent testing.

In this manner, the pillar array test device described above has two primary areas of density. The first area density is the density of the bit cells in the grid of bit cells. The second area density is the density of the magnetic tunnel junction pillars produced on the centrally located bit cell. Each of the bit cells has to have at least a minimum pitch width between them in order to be manufacturable. This limits the achievable density of the grid of bit cells to what is referred as a first level of density. In a normal functioning device, there is one magnetic tunnel junction pillar manufactured on each bit cell. Thus the density of the bit cells becomes the density magnetic tunnel junction pillars. With the pillar array test device of the present invention described above, the magnetic tunnel junction pillars are fabricated all on the centrally located bit cell. This achieves a second level of density of the magnetic tunnel junction pillars that is much higher than the first level of density of the grid of bit cells. Once the magnetic tunnel junction pillars are fabricated, conductive traces are used to link each individual magnetic tunnel junction pillar to a respective bit cell of the grid.

The purpose of producing such a device is to simulate magnetic tunnel junction pillar density that may be available 2 to 3 generations of CMOS fabrication processes later. The pillar array test device enables a manufacturer to test magnetic interactions between adjacent magnetic tunnel junction pillars in a high density array. The magnetic tunnel junction pillars are addressed and read or written to in a conventional manner (e.g., bit lines, source lines, word lines, etc.). The pillar array test device enables the study and characterization of any electromagnetic interference that may occur between the pillars. This allows intensive preparation for next generations of MRAM device manufacture.

Embodiments of the present invention provide the advantage that the new development in MRAM devices can be independently experimented and tested without having to invest significant effort into developing a new CMOS platform used in addressing the MRAM devices. The time and cost to develop a new CMOS platforms is many orders of magnitude higher than the approach of the embodiments of the present invention. The magnetic interactions between a high density array of adjacent magnetic tunnel junction pillars and electronic interference that may occur between them can be closely tested and studied. This allows intensive preparation for next generations of MRAM device manufacture.

FIG. 1 shows the steps of a process 100 for a photo and/or electron beam lithographic fabricating processes for producing a pillar array test device in accordance with one embodiment of the present invention. Process 100 begins in step 102 where a CMOS platform wafer is received for processing. As shown in step 102, the wafer includes a plurality of rectangular bit cells arranged in a grid. These bit cells are at a relatively low density since the bit cells cannot be manufactured below a minimum pitch width. These bit cells each include a driving transistor for connecting to a respective magnetic tunnel junction. The wafer is received with a top layer of silicon oxide for passivation. In step 104, a plurality of metal posts are fabricated for each individual bottom electrode pad and then planarized. A plurality of bottom electrode traces are then etched to connect a plurality of bottom electrode pads in a centrally located bit cell to each of the bit cells in the grid. Instead of locating a single MTJ device in a single bit cell, embodiments of the present invention will position multiple MTJ devices on a single centrally located bit cell. A multilayer lithographic technique will be used to fabricate metal traces to connect individual MTJ devices to individual bit cells and the associated CMOS driving transistor. In one embodiment, each of the plurality of bottom electrode traces comprises tantalum nitride.

In step 106, metal pads are fabricated from each individual bottom electrode pad and then planarized as shown. Additionally, an iterative process is utilized to fabricate metal lines to connect individual MTJ devices to individual bit cells and the associated CMOS driving transistor, creating a fan out pattern 107 as shown.

Figure 2A:
FIG. 2A shows the steps of a process for a photo and/or electron beam lithographic fabricating processes for producing a pillar array test device in accordance with one embodiment of the present invention.
Figure 2A:
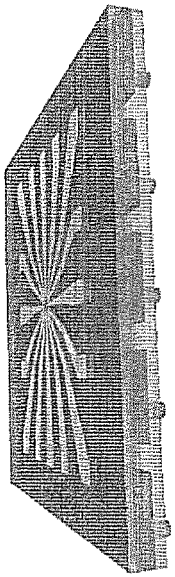
Figure 2A:
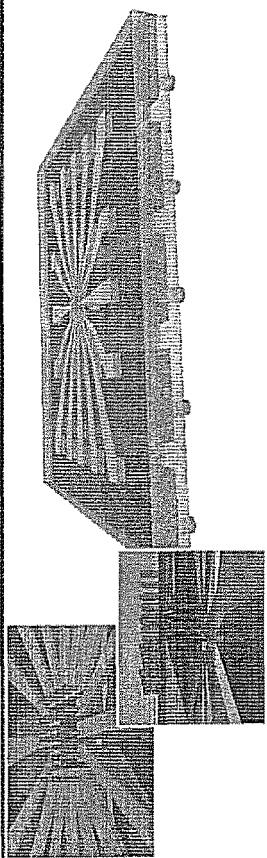

FIG. 2A shows the steps of a process 200 for a photo and/or electron beam lithographic fabricating processes for producing a pillar array test device in accordance with one embodiment of the present invention. Step 202 shows the wafer with the front of CMOS platform having silicon oxide passivation on top. This is basically the wafer as it appears at the conclusion of step 106 of FIG. 1. In step 204, an additional number of bottom electrode traces are fabricated to connect a plurality of bottom electrode pads in a centrally located bit cell to each of the bit cells in the grid. This is shown by the fan out of traces which each route towards the centrally located bit cell. In step 206, new metal posts are created on the centrally located bottom electrode pad to serve as a base for subsequently manufactured magnetic tunnel junction pillars. After the posts have been fabricated, the wafer is planarized.

Figure 2B:
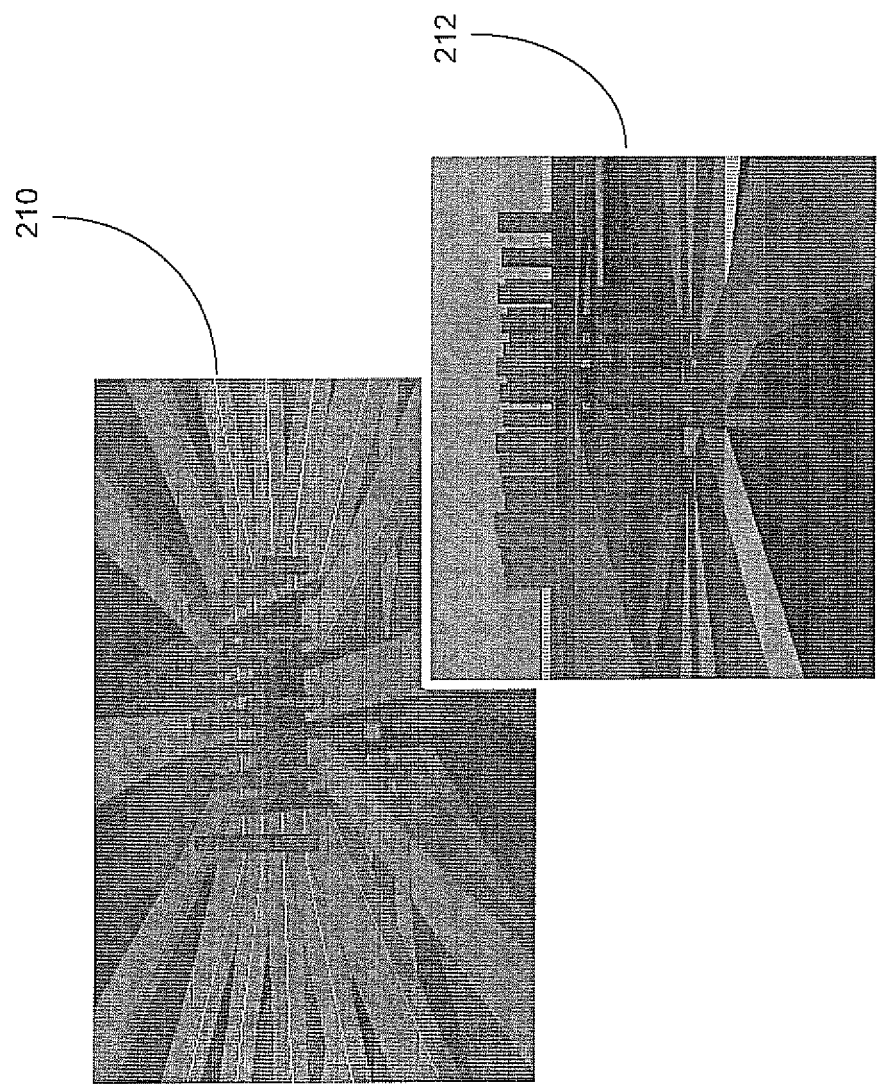
FIG. 2B shows the steps of a process for a photo and/or electron beam lithographic fabricating processes for producing a pillar array test device in accordance with one embodiment of the present invention.

FIG. 2B shows enlarged views 210 and 212 showing the connections of the high density pillars and the fan out of traces which each route outward to connect to the respective bit cells. In this manner, the high-density pillars having density much higher than the density of the grid of bit cells. Since each of the pillars must still be connected to a respective one of the bit cells, the fan out pattern shown in views 210 and 212 are used to implement the connections.

Figure 3:
FIG. 3 shows the steps of a process for a photo and/or electron beam lithographic fabricating processes for producing a pillar array test device in accordance with one embodiment of the present invention.
Figure 3:
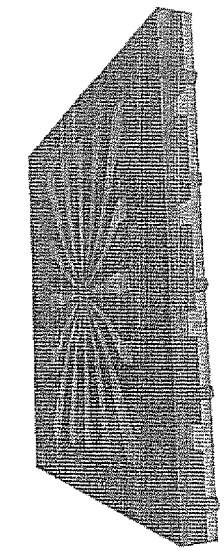
Figure 3:
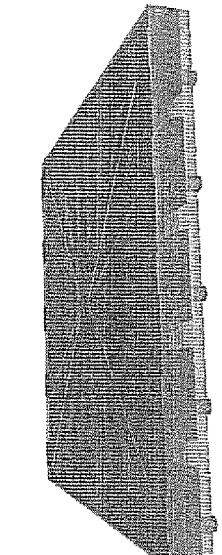

FIG. 3 shows the steps of a process 300 for a photo and/or electron beam lithographic fabricating processes for producing a pillar array test device in accordance with one embodiment of the present invention. Step 302 shows wafer after the magnetic tunnel junction stack deposition layers are deposited. Step 304 shows the ion beam etching of HDP (high-density pillar) magnetic tunnel junction pillar arrays after electron beam lithography. It should be noted that the density of the pillar array is much higher than the density of the grid of bit cells. Step 306 shows how a plurality of top electrode traces fanning out to connect the plurality of magnetic tunnel junction pillars in the centrally located bit cell to each of the bit cells in the grid. The wafer is now ready for outputting for subsequent testing. In one embodiment, the plurality of top electrode traces connect to the bit cells in the grid using vias. In one embodiment, each of the plurality of top electrode traces comprises tantalum nitride.

It should be noted that each of the steps 102 through 106, 202 through 206, and 302 through 306 are implemented using conventional CMOS fabrication techniques on conventional CMOS equipment. By fabricating the HDP magnetic tunnel junction pillar array in the centrally located cell, very high magnetic tunnel junction densities are achieved. Since each magnetic tunnel junction pillar is connected to its own respective bit cell from the bottom electron traces and the top electron traces, each magnetic tunnel junction pillar is individually addressable for testing using a lower density bit cell array. The HDP magnetic tunnel junction pillar array allows testing to examine the effects of magnetic fields from closely adjacent magnetic tunnel junction pillars, for example.

In this manner, embodiments of the present invention implement a method for a photo and/or electron beam lithographic fabricating processes for producing a pillar array test device. Embodiments of the present invention implement a fabrication process that will produce a state-of-the-art high density MTJ pillar array to create a test platform to test state-of-the-art MTJ devices. Embodiments of the present invention implement a fabrication process that will produce a state-of-the-art high density MTJ pillar array. Additionally, embodiments of the present invention advantageously utilizes existing CMOS design configurations without having to invest to develop new CMOS test platform fabrication processes.

Figure 4:
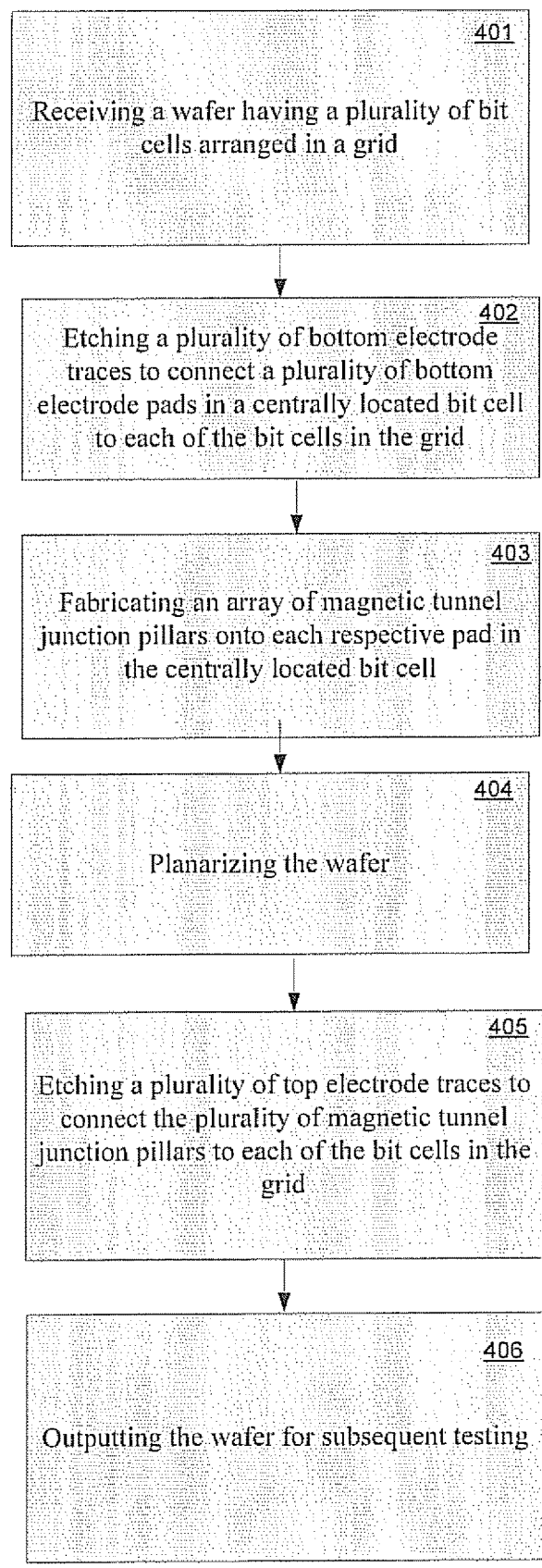
FIG. 4 shows a flowchart of the steps of a photo and/or electron beam lithographic fabricating processes for producing a pillar array test device.

FIG. 4 shows a flowchart of the steps of a photo and/or electron beam lithographic fabricating processes 400 for a photo and/or electron beam lithographic fabricating processes for producing a pillar array test device. In step 401, process 400 begins with receiving a wafer having a plurality of bit cells arranged in a grid. In step 402, process 400 proceeds with etching a plurality of bottom electrode traces to connect a plurality of bottom electrode pads in a centrally located bit cell to each of the bit cells in the grid. In step 403, process 400 proceeds with fabricating an array of magnetic tunnel junction pillars onto each respective pad in the centrally located bit cell. In step 404, the wafer is then planarized. In step 405, process 400 proceeds with etching a plurality of top electrode traces to connect the plurality of magnetic tunnel junction pillars to each of the bit cells in the grid. In step 406, the wafer is output for subsequent testing.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A device, comprising:
a grid of bit cells having a first density;
an array of pillars fabricated on a centrally located bit cell having a second density that is higher than the first density;
a bottom electrode layer comprising a plurality of bottom electrode traces connecting each of the memory cell pillars to a respective one of the grid of bit cells in a first fanout pattern; and
a top electrode layer comprising a plurality of top electrode traces connecting each of the memory cell pillars to a respective one of the grid of bit cells in a second fanout pattern.

2. The device of claim 1, wherein the plurality of top electrode traces connect to the bit cells in the grid using vias.

3. The device of claims 1, further comprising an array of metal posts located on top of the plurality of bottom electrode traces and operable to function as a base for the array of memory cell pillars.

4. The device of claim 1, wherein each of the plurality of bottom electrode traces comprises tantalum nitride.

5. The device of claim 1, wherein each of the plurality of top electrode traces comprises tantalum nitride.

6. The device of claim 1, wherein each of the grid of bit cells further comprises a CMOS driving transistor for individually addressing each of the memory cell pillars.

7. The device of claim 1, further comprising a silicon oxide passivation layer on the surface of the device.

8. A device, comprising:
a grid of bit cells having a first density;
an array of memory cell pillars fabricated on a centrally located bit cell having a second density that is higher than the first density;
a bottom electrode layer comprising of a plurality of bottom electrode traces connecting each of the memory cell pillars to a respective one of the grid of bit cells in a first fanout pattern;
a top electrode layer comprising a plurality of top electrode traces connecting each of the memory cell pillars to a respective one of the grid of bit cells in a second fanout pattern; and
a silicon oxide passivation layer on the surface of the device.

9. The device of claim 8, wherein the plurality of top electrode traces connect to the bit cells in the grid using vias.

10. The device of claim 8, further comprising an array of metal posts located on top of the plurality of bottom electrode traces and function as a base for the array of memory cell pillars.

11. The device of claim 8, wherein each of the plurality of bottom electrode traces comprises tantalum nitride.

12. The device of claim 8, wherein each of the plurality of top electrode traces comprises tantalum nitride.

13. The device of claim 8, wherein each of the grid of bit cells further comprises a CMOS driving transistor for individually addressing each of the memory cell pillars.

14. A device, comprising:
- a grid of bit cells having a first density;
- an array of memory cell pillars fabricated on a centrally located bit cell having a second density that is higher than the first density;
- a bottom electrode layer comprising a plurality of bottom electrode traces connecting each of the memory cell pillars to a respective one of the grid of bit cells in a first fanout pattern;
- a top electrode layer comprising a plurality of top electrode traces connecting each of the memory cell to a respective one of the grid of bit cells in a second fanout pattern; and
- a CMOS driving transistor for individually addressing each of the memory cell pillars.

15. The device of claim 14, wherein the plurality of top electrode traces connect to the bit cells in the grid using vias.

16. The device of claim 14, wherein an array of metal posts are located on top of the plurality of bottom electrode traces and function as a base for the array of memory cell pillars.

17. The device of claim 14, wherein each of the plurality of bottom electrode traces comprises tantalum nitride.

18. The device of claim 14, wherein each of the plurality of top electrode traces comprises tantalum nitride.

19. The device of claim 14, further comprising a silicon oxide passivation layer on the surface of the device.

20. The device of claim 14, further comprising a plurality of contact points operable to interface with a CMOS testing device.

21. The device of claim 14, wherein the device comprises a pillar array test device.

22. The device of claim 14, wherein the memory cell pillars comprise magnetic tunnel junction pillars.

23. The device of claim 1, wherein the memory cell pillars comprise magnetic tunnel junction pillars.

24. The device of claim 8, wherein the memory cell pillars comprise magnetic tunnel junction pillars.

* * * * *